US008452251B2

(12) United States Patent
Saunders

(10) Patent No.: US 8,452,251 B2
(45) Date of Patent: May 28, 2013

(54) PRESELECTOR AMPLIFIER

(75) Inventor: David R. Saunders, Scottsdale, AZ (US)

(73) Assignee: ViaSat, Inc., Carlsbad, CA (US)

( * ) Notice: Subject to any disclaimer, the term of this patent is extended or adjusted under 35 U.S.C. 154(b) by 461 days.

(21) Appl. No.: 12/758,996

(22) Filed: Apr. 13, 2010

(65) Prior Publication Data

US 2010/0259325 A1 Oct. 14, 2010

Related U.S. Application Data

(60) Provisional application No. 61/237,967, filed on Aug. 28, 2009, provisional application No. 61/259,375, filed on Nov. 9, 2009, provisional application No. 61/234,513, filed on Aug. 17, 2009, provisional application No. 61/222,354, filed on Jul. 1, 2009, provisional application No. 61/168,913, filed on Apr. 13, 2009, provisional application No. 61/259,049, filed on Nov. 6, 2009, provisional application No. 61/234,521, filed on Aug. 17, 2009, provisional application No. 61/265,605, filed on Dec. 1, 2009, provisional application No. 61/222,363, filed on Jul. 1, 2009.

(51) Int. Cl.
*H04B 1/16* (2006.01)
*H04B 1/10* (2006.01)

(52) U.S. Cl.
USPC .................. 455/307; 455/296; 455/303

(58) Field of Classification Search
USPC .......... 455/266, 296, 303, 304, 306, 307, 455/334, 339, 340; 330/124 R, 149; 327/551, 327/552, 553, 557
See application file for complete search history.

(56) References Cited

U.S. PATENT DOCUMENTS

| | | | | |
|---|---|---|---|---|
| 3,119,965 A | | 1/1964 | Phillips | |
| 3,842,362 A | * | 10/1974 | Dimon | 330/103 |
| 4,857,777 A | | 8/1989 | Altes | |
| 4,857,778 A | * | 8/1989 | Hague | 327/555 |
| 4,896,374 A | | 1/1990 | Waugh et al. | |
| 4,965,602 A | | 10/1990 | Kahrilas et al. | |
| 4,994,773 A | | 2/1991 | Chen et al. | |
| 5,045,822 A | | 9/1991 | Mohwinkel | |
| 5,270,719 A | | 12/1993 | Roth | |

(Continued)

FOREIGN PATENT DOCUMENTS

| | | |
|---|---|---|
| EP | 0762660 | 3/1997 |
| EP | 1193861 | 4/2002 |

(Continued)

OTHER PUBLICATIONS

International Preliminary Report dated Oct. 27, 2011 from PCT/US10/030864.

(Continued)

*Primary Examiner* — Blane J Jackson
(74) *Attorney, Agent, or Firm* — Snell & Wilmer LLP

(57) ABSTRACT

A preselector amplifier system and method including of various components is described. The various components may include a vector generator, an active power splitter, an active power combiner, or the like. The preselector amplifier may be integral to and/or coupled to a communications system. The communications system may be at least one of a transceiver, receiver and/or transmitter. The communications system may transmit radio frequency (RF) signals.

27 Claims, 15 Drawing Sheets

U.S. PATENT DOCUMENTS

| | | | |
|---|---|---|---|
| 5,942,929 A | 8/1999 | Aparin | |
| 5,966,049 A | 10/1999 | Yuen et al. | |
| 6,005,515 A | 12/1999 | Allen et al. | |
| 6,061,553 A | 5/2000 | Matsuoka et al. | |
| 6,232,837 B1 | 5/2001 | Yoo et al. | |
| 6,326,845 B1 | 12/2001 | Miyaji et al. | |
| 7,081,788 B2 * | 7/2006 | Hagari | 327/553 |
| 7,177,615 B2 * | 2/2007 | Ono | 455/296 |
| 7,319,345 B2 | 1/2008 | Farjad-rad et al. | |
| 7,355,470 B2 | 4/2008 | Sorrells et al. | |
| 7,378,902 B2 | 5/2008 | Sorrells et al. | |
| 7,400,193 B2 | 7/2008 | Wyatt | |
| 7,408,507 B1 | 8/2008 | Paek et al. | |
| 7,420,423 B2 | 9/2008 | Lee et al. | |
| 7,421,036 B2 | 9/2008 | Sorrells et al. | |
| 7,620,129 B2 | 11/2009 | Sorrells et al. | |
| 7,672,653 B2 * | 3/2010 | Cowley et al. | 455/188.1 |
| 7,715,815 B2 * | 5/2010 | Gomez | 455/307 |
| 7,728,784 B2 | 6/2010 | Mohamadi | |
| 7,746,764 B2 | 6/2010 | Rawlins et al. | |
| 7,750,733 B2 | 7/2010 | Sorrells et al. | |
| 7,755,430 B2 | 7/2010 | Imagawa | |
| 7,885,682 B2 | 2/2011 | Sorrells et al. | |
| 8,013,784 B2 | 9/2011 | Margomenos et al. | |
| 2002/0113648 A1 | 8/2002 | Miyaji et al. | |
| 2003/0016085 A1 | 1/2003 | Yamazaki | |
| 2003/0162566 A1 | 8/2003 | Shapira et al. | |
| 2004/0095190 A1 | 5/2004 | Klaren | |
| 2004/0121750 A1 | 6/2004 | Nation | |
| 2004/0229584 A1 | 11/2004 | Fischer et al. | |
| 2005/0113052 A1 | 5/2005 | Rabinovich | |
| 2005/0151698 A1 | 7/2005 | Mohamadi | |
| 2006/0170499 A1 | 8/2006 | Rahman et al. | |
| 2007/0248186 A1 | 10/2007 | Sorrells et al. | |
| 2007/0275674 A1 | 11/2007 | Chien | |
| 2007/0280384 A1 | 12/2007 | Hidaka | |
| 2008/0051053 A1 * | 2/2008 | Fedan | 455/296 |
| 2008/0129408 A1 | 6/2008 | Nagaishi et al. | |
| 2008/0129634 A1 | 6/2008 | Pera | |
| 2008/0218424 A1 | 9/2008 | Blanton | |
| 2009/0091384 A1 | 4/2009 | Sorrells et al. | |
| 2010/0039174 A1 | 2/2010 | Teetzel | |
| 2010/0073085 A1 | 3/2010 | Sorrells et al. | |
| 2010/0097138 A1 | 4/2010 | Sorrells et al. | |
| 2010/0225389 A1 | 9/2010 | Teetzel | |
| 2010/0321107 A1 * | 12/2010 | Honcharenko | 330/124 R |

FOREIGN PATENT DOCUMENTS

| | | |
|---|---|---|
| JP | 2003168938 | 6/2003 |
| WO | WO9945609 | 8/1999 |
| WO | WO0003456 | 1/2000 |
| WO | WO0241442 | 5/2002 |
| WO | WO03036756 | 5/2003 |

OTHER PUBLICATIONS

International Preliminary Report dated Oct. 27, 2011 from PCT/US10/30868.
International Preliminary Report dated Oct. 27, 2011 from PCT/US10/30881.
International Preliminary Report dated Oct. 27, 2011 from PCT/US10/30872.
International Preliminary Report dated Oct. 27, 2011 from PCT/US10/30871.
International Preliminary Report dated Oct. 27, 2011 from PCT/US10/30866.
International Preliminary Report dated Oct. 27, 2011 from PCT/US10/30876.
International Search Report and Written Opinion dated Oct. 27, 2010, PCT/US10/030876, 8 pages.
International Search Report and Written Opinion dated Nov. 18, 2010, PCT/US10/30871, 10 pages.
International Search Report and Written Opinion dated Nov. 26, 2010, PCT/US10/30868, 10 pages.
International Search Report and Written Opinion dated Nov. 26, 2010, PCT/US10/30877, 10 pages.
Tokumitsu et al.—Active isolator, combiner, divider and magic-T as miniaturized function blocks dated Nov. 6, 1998.
International Search Report and Written Opinion dated Nov. 26, 2010, PCT/US10/30866, 8 pages.
Aminghasem Safarian et al., Distributed Active Power Combiners and Splitters for Multi-Antenna UWB.
Viallon et al. An Original SiGe Active Differential Output Power Splitter for Millimetre-wave Applications, 2003.
International Search Report and Written Opinion dated Nov. 26, 2010, PCT/US10/30892, 9 pages.
Office Action dated Feb. 27, 2012 in U.S. Appl. No. 12/759,130.
Notice of Allowance dated Feb. 28, 2012 in U.S. Appl. No. 12/759,059.
Office Action dated May 7, 2012 in U.S. Appl. No. 12/759,113.
International Search Report and Written Opinion dated Jul. 19, 2010, PCT US10/030881,149 pages.
International Search Report and Written Opinion dated Aug. 23, 2010, PCT/US2010/30864, 12 pages.
Kwang-Jin, Koh, Gabriel M. Rebeiz, 0.13-mu m CMOS phase shifters for X-, Ku, and K-band phased arrays, IEEE Journal of Solid State Circuits, 2007, 14 pages.
Kwang-Jin, Koh, Jason W. May, Gabriel M. Rebeiz A Q-Band (40-45 GHz) 16-Element Phased-Array Transmitter in 0.18-µm SiGe BiCMOS Technology, IEEE Radio Frequency Integrated Circuits Symposium, 2008, 4 pages.
Kwang-Jin, Koh, Gabriel M. Rebeiz, an X- and Ku-Band 8-Element Phased-Array Receiver in 0.18-µm SiGe BiCMOS Technology, IEEE Journal of Solid State Circuits, Jun. 2008, 12 pages.
Office Action dated Jan. 4, 2012 from U.S. Appl. No. 12/759,148.
Notice of Allowance dated Jul. 27, 2011 in U.S. Appl. No. 12/759,064.
USPTO; Office Action dated Apr. 7, 2011 in U.S. Appl. No. 12/759,064.
Zheng et al., "Full 360 degree Vector-Sum Phase-Shifter for Microwave System Applications," IEEE Transactions on Circuits and Systems I: Regular Papers, Downloaded on Jul. 8, 2009, pp. 1-7.
Ayari et al., "Automatic Test Vector Generation for Mixed-Signal Circuits," 1995, Ecole Polytechnique of the University of Montreal, 6 pages.
Strassberg, Dan, "RF-vector-signal generator combines high throughput, low phase noise," EDN, Oct. 6, 2009, 2 pages, UBM Electronics.
International Preliminary Report on Patentability dated Jul. 21, 2011 from PCT/US2010/030877.
International Preliminary Report on Patentability dated Jul. 21, 2011 from PCT/US10/30906.
International Preliminary Report on Patentability dated Jul. 21, 2011 from PCT/US10/30892.
Office Action dated Sep. 29, 2011 from U.S. Appl. No. 12/759,059.
Aminghasem Safarian et al., "Distributed Active Power Combiners and Splitters for Multi-Antenna UWB Transceivers" Sep. 2006, pp. 138-141.
Notice of Allowance dated Aug. 14, 2012 in U.S. Appl. No. 12/759,123.
Notice of Allowance dated Aug. 20, 2012 in U.S. Appl. No. 12/759,148.
Office Action dated Aug. 21, 2012 in U.S. Appl. No. 12/759,113.
Final Office Action dated Sep. 17, 2012 in U.S. Appl. No. 12/759,043.
International Search Report and Written Opinion dated Nov. 26, 2010, PCT/US10/30872, 9 pages.
Hsiao Analysis of Interleaved Arrays of Nov. 1971.
International Search Report and Written Opinion dated Nov. 30, 2010, PCT/US10/30906, 11 pages.
Supplemental Notice of Allowability dated Jun. 11, 2012 in U.S. Appl. No. 12/759,130.
Notice of Allowance dated May 10, 2012 in U.S. Appl. No. 12/759,130.
Office Action dated May 17, 2012 in U.S. Appl. No. 12/759,043.
Supplemental Notice of Allowability dated May 29, 2012 in U.S. Appl. No. 12/759,130.
Office Action dated May 29, 2012 in U.S. Appl. No. 12/759,123.
Final Office Action dated Jun. 5, 2012 in U.S. Appl. No. 12/759,148.

* cited by examiner

PRESELECTOR AMPLIFIER

CROSS REFERENCE TO RELATED APPLICATIONS

This application is a non-provisional of U.S. Provisional Application No. 61/237,967, entitled "ACTIVE BUTLER AND BLASS MATRICES," which was filed on Aug. 28, 2009. This application is also a non-provisional of U.S. Provisional Application No. 61/259,375, entitled "ACTIVE HYBRIDS FOR ANTENNA SYSTEMS," which was filed on Nov. 9, 2009. This application is a non-provisional of U.S. Provisional Application No. 61/234,513, entitled "ACTIVE FEED FORWARD AMPLIFIER," which was filed on Aug. 17, 2009. This application is a non-provisional of U.S. Provisional Application No. 61/222,354, entitled "ACTIVE PHASED ARRAY ARCHITECTURE," which was filed on Jul. 1, 2009. This application is a non-provisional of U.S. Provisional Application No. 61/168,913, entitled "ACTIVE COMPONENT PHASED ARRAY ANTENNA," which was filed on Apr. 13, 2009. This application is also a non-provisional of U.S. Provisional Application No. 61/259,049, entitled "DYNAMIC REAL-TIME POLARIZATION FOR ANTENNAS," which was filed on Nov. 6, 2009. This application is a non-provisional of U.S. Provisional Application No. 61/234,521, entitled "MULTI-BAND MULTI-BEAM PHASED ARRAY ARCHITECTURE," which was filed on Aug. 17, 2009. This application is a non-provisional of U.S. Provisional Application No. 61/265,605, entitled "HALF-DUPLEX PHASED ARRAY ANTENNA SYSTEM," which was filed on Dec. 1, 2009. This application is a non-provisional of U.S. Provisional Application No. 61/222,363, entitled "BIDIRECTIONAL ANTENNA POLARIZER," which was filed on Jul. 1, 2009. All of the contents of the previously identified applications are hereby incorporated by reference for any purpose in their entirety.

BACKGROUND OF THE INVENTION

Conventional receivers use a passive filter preceding a low noise amplifier (LNA) to reject interference outside the frequency band of interest (with reference to prior art FIG. 1). The LNA is then used to amplify the multiple signals within the frequency band of interest. The conventional passive filters are generally large in size. Additionally, the passive filter(s) have a fixed predetermined bandwidth and out-of-band rejection. The LNA amplifies all signals and interferers within the frequency band of interest by an amplification factor that is generally relatively constant across the frequency band of interest. Thus, if an interferer is located within the frequency band of interest, it is amplified. The amplification gain and in-band interferer 108 amplification is depicted in prior art FIG. 1.

Thus, a need exists for a communication system that can adapt to varied frequency bands of interest and reduce interferers within frequency band and/or frequency bands of interest. Also, a need exists for a communications system that is reconfigurable for different frequency bands of interest.

SUMMARY

In one exemplary embodiment, a communications system including a filter is disclosed. In this exemplary embodiment, the filter may be configured to receive a frequency band of interest. In this exemplary embodiment, the filter may be configured to attenuate in-band interferers and attenuate out-of-band interferers. In this exemplary embodiment, the filter may be reconfigurable during operation by digital or analog controls without changes in cavity shape, circuit capacitance, or circuit inductance.

In one exemplary embodiment, a method may include, receiving a frequency band of interest; attenuating in-band interferers; and attenuating out-of-band interferers. In this exemplary embodiment, the filtering is configurable during operation. In this exemplary embodiment, the frequency band of interest is configurable during operation. In this exemplary embodiment, the attenuating occurs in response to filtering performed by an active filter.

In one exemplary embodiment, an active preselector amplifier may include a plurality of signal paths. In this exemplary embodiment, at least one of the signal paths may include a variable gain amplifier. In this exemplary embodiment, at least one of the parallel paths may include at least one delay unit and variable gain amplifier.

In one exemplary embodiment, an active preselector amplifier having an input and an output is disclosed. In this exemplary embodiment, the active preselector amplifier includes at least one splitter, combiner, and delay unit configured to form a plurality of signal paths between the active preselector amplifier input and the active preselector amplifier output. In this exemplary embodiment, at least one of the splitter, combiner, and delay unit may be an active splitter, active combiner, and vector generator respectively. In this exemplary embodiment, the active preselector amplifier is configured to attenuate in-band and out-of-band interferers.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

DETAILED DESCRIPTION OF THE INVENTION

While exemplary embodiments are described herein in sufficient detail to enable those skilled in the art to practice the invention, it should be understood that other embodiments may be realized and that logical material, electrical, and mechanical changes may be made without departing from the spirit and scope of the invention. Thus, the following detailed description is presented for purposes of illustration only.

In an exemplary embodiment, a preselector amplifier is comprised of various components. The various components may include a vector generator, an active power splitter, an active power combiner, or the like. The preselector amplifier may be integral to and/or coupled to a communications system. The communications system may be at least one of a transceiver, receiver and/or transmitter. The communications system may transmit radio frequency (RF) signals.

Figure 1:
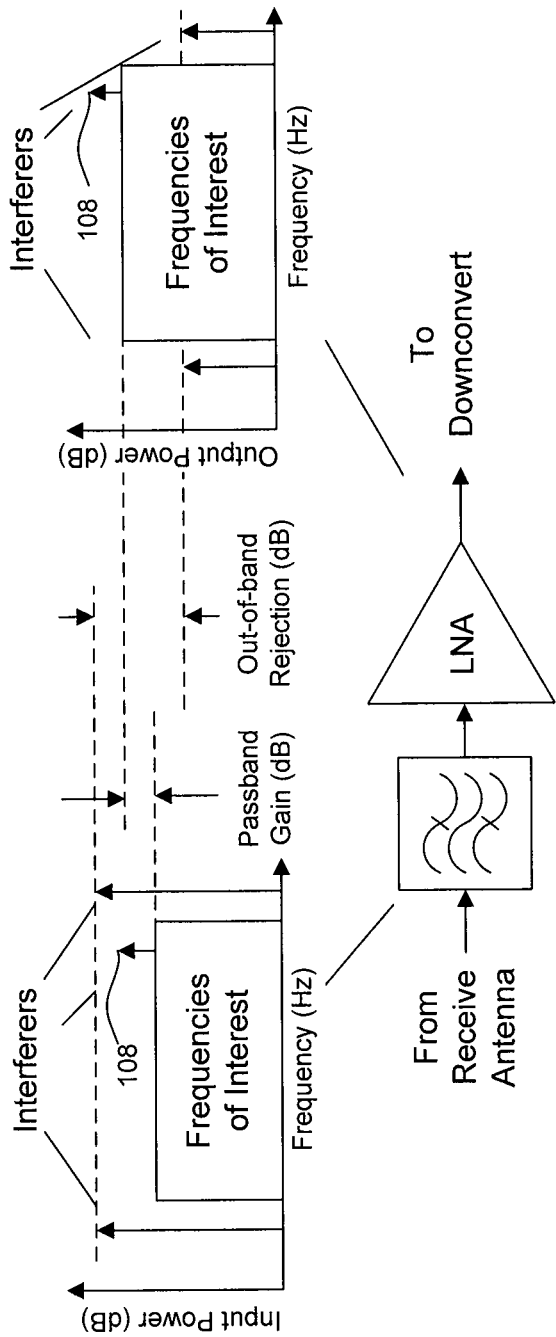
FIG. 1 illustrates a prior art example of a passive filter preceding a low noise amplifier receiver frequency plan.
Figure 2:
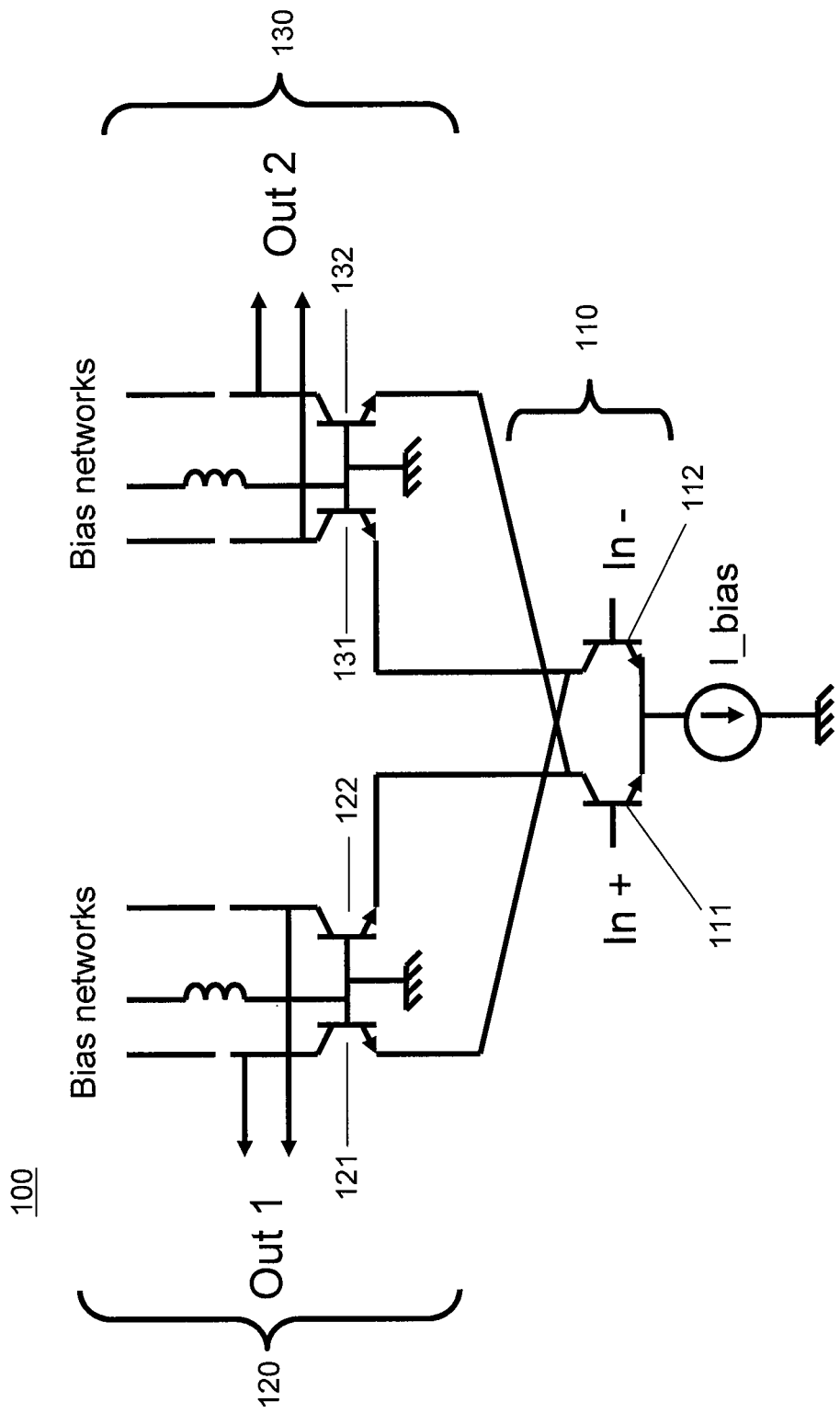
FIG. 2 illustrates an exemplary embodiment of an active power splitter.

Active Splitter: FIG. 2 illustrates a schematic of an exemplary active power splitter. In an exemplary embodiment, an active power splitter 100 comprises a differential input subcircuit 110, a first differential output subcircuit 120, and a second differential output subcircuit 130. The differential input subcircuit 110 has paired transistors 111, 112 with a common emitter node and is constant current biased, as is typical in a differential amplifier. An input signal is communicated to the base of paired transistors 111, 112 in the differential input subcircuit 110. Both the first and second differential output subcircuits 120, 130 comprise a pair of transistors with a common base node and each common base is connected to ground.

The first differential output subcircuit 120 has a first transistor 121 emitter connected to the collector of one of the input subcircuit transistors 112. The emitter of the second output subcircuit transistor 122 is connected to the collector of the other input subcircuit transistor 111. In the exemplary embodiment, the first output is drawn from the collectors of transistors 121, 122 of the first differential output subcircuit 120. Furthermore, the second differential output subcircuit 130 is similarly connected, except the transistor 131, 132 emitters are inversely connected to the input subcircuit transistor 111, 112 collectors with respect to transistors 121, 122.

By inverting the input subcircuit transistor collector connections between the first and second differential output subcircuits, the first output and the second output are approximately 180° out of phase with each other. In another exemplary embodiment, transistor 131, 132 emitters are noninversely connected to input subcircuit transistor 111, 112 collectors, causing the first output and the second output to be approximately in phase with each other. In general, the absolute phase shift of the output signals through the power splitter is not as important as the relative phasing between the first and second output signals.

In an exemplary embodiment, active power splitter 100 converts an input RF signal into two output signals. The output signal levels may be equal in amplitude, though this is not required. For a prior art passive power splitter, each output signal would be about 3 dB lower in power than the input signal. In contrast, an exemplary active splitter, such as active power splitter 100, can provide gain and the relative power level between the input signal and the output signal is adjustable and can be selectively designed. In an exemplary embodiment, the output signal is configured to achieve a substantially neutral or positive power gain over the input signal. For example, the output signal may be configured to achieve a 3 dB signal power gain over the input signal. In an exemplary embodiment, the output signal may achieve a power gain in the 0 dB to 5 dB range. Moreover, the output signal may be configured to achieve any suitable power gain.

In another exemplary embodiment, active power splitter 100 additionally provides matched impedances at the input and output ports. The matched impedances may be 50 ohms, 75 ohms, or other suitable impedances. Furthermore, in an exemplary embodiment, active splitter 100 provides isolation between the output ports of the active power splitter. In one exemplary embodiment, active power splitter 100 is manufactured as a RFIC with a compact size that is independent of the operating frequency due to a lack of distributed components.

Figure 3A:
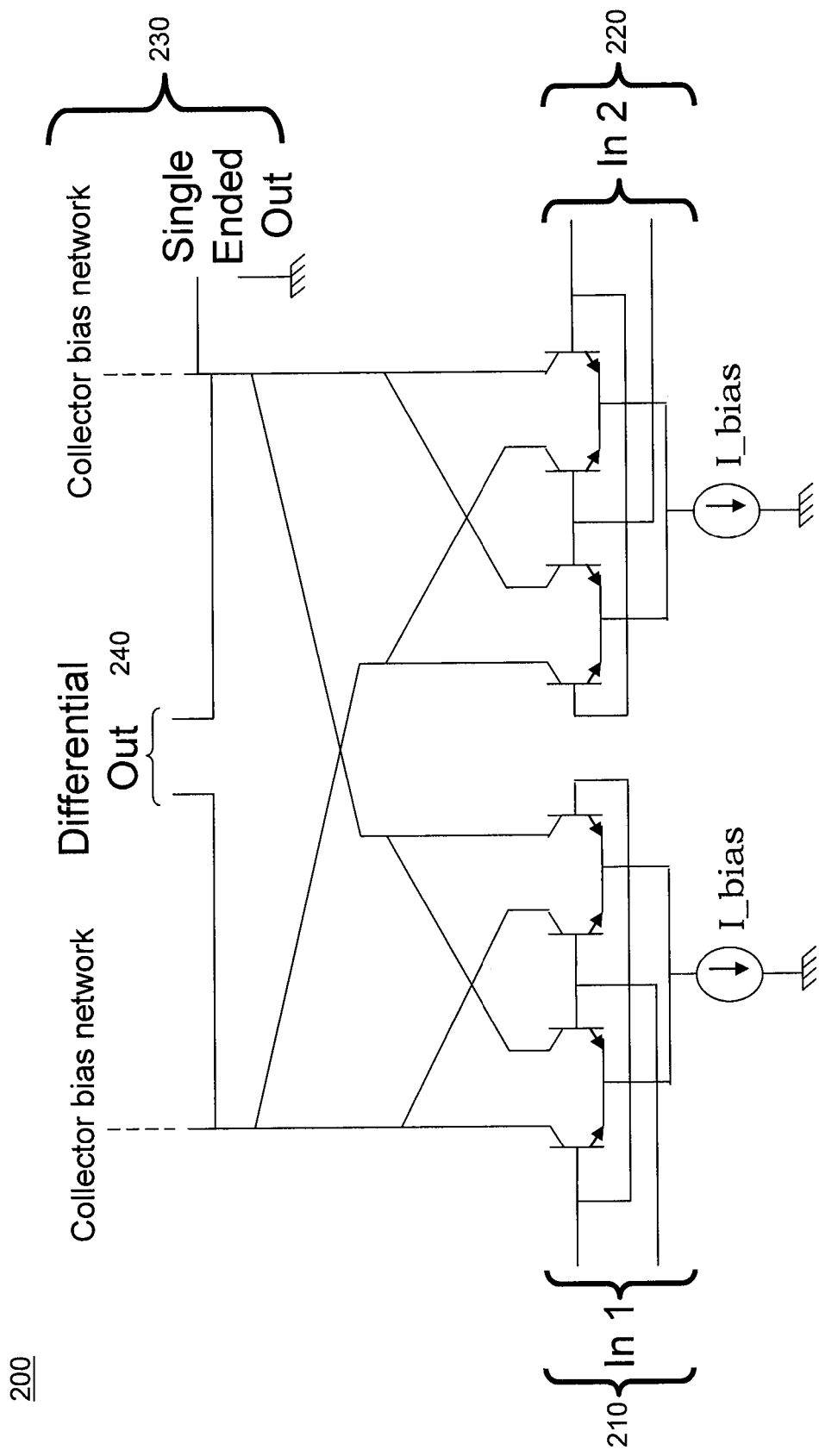
FIG. 3A illustrates an exemplary embodiment of an active power combiner.

Active Combiner: In an exemplary embodiment and with reference to FIG. 3A, an active power combiner 200 comprises a first differential input subcircuit 210, a second differential input subcircuit 220, a single ended output subcircuit 230, and a differential output subcircuit 240. Each differential input subcircuit 210, 220 includes two pairs of transistors, with each transistor of each differential input subcircuit 210, 220 having a common emitter node with constant current biasing, as is typical in a differential amplifier.

A first input signal is communicated to the bases of the transistors in first differential input subcircuit 210. For example, a first line of input signal In1 is provided to one transistor of each transistor pair in first differential input subcircuit 210, and a second line of input signal In1 is provided to the other transistor of each transistor pair. Similarly, a second input signal is communicated to the bases of the transistors in second differential input subcircuit 220. For example, a first line of input signal In2 is provided to one transistor of each transistor pair in first differential input subcircuit 220, and a second line of input signal In2 is provided to the other transistor of each transistor pair. Furthermore, in an exemplary embodiment, a differential output signal is formed by a combination of signals from collectors of transistors in first and second differential input subcircuits 210, 220.

In an exemplary embodiment, active power combiner 200 converts two input RF signals into a single output signal. The output signal can either be a single ended output at single ended output subcircuit 230, or a differential output at differential output subcircuit 240. In other words, active power combiner 200 performs a function that is the inverse of active power splitter 100. The input signal levels can be of arbitrary amplitude and phase. Similar to an active power splitter, active power combiner 200 can provide gain and the relative power level between the inputs and output is also adjustable and can be selectively designed. In an exemplary embodiment, the output signal achieves a substantially neutral or positive signal power gain over the sum of the input signals. For example, the output signal may achieve a 3 dB power gain over the sum of the input signals. In an exemplary embodiment, the output signal may achieve a power gain in the 0 dB to 5 dB range. Moreover, the output signal may achieve any suitable power gain.

In an exemplary embodiment, active power combiner 200 additionally provides matched impedances at the input and output ports. The matched impedances may be 50 ohms, 75 ohms, or other suitable impedances. Furthermore, in an exemplary embodiment, active power combiner 200 provides isolation between the input ports of the power combiner. In one exemplary embodiment, active power combiner 200 is manufactured as a RFIC with a compact size that is independent of the operating frequency due to a lack of distributed components.

Figure 3B:
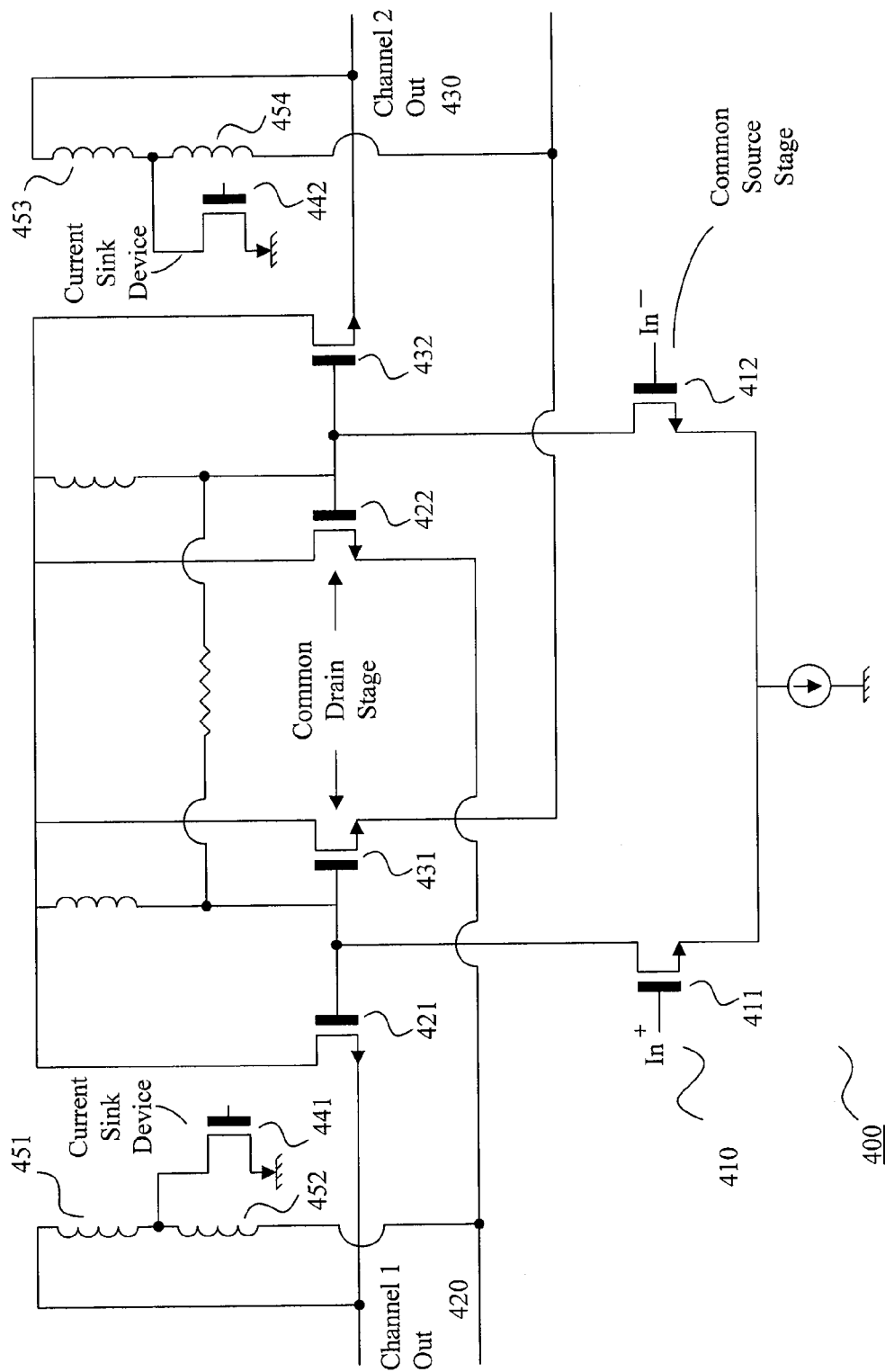
FIG. 3B illustrates another exemplary embodiment of an active power combiner.

In an exemplary embodiment and with renewed reference to FIG. 3B, active power combiner 400 is depicted. In an exemplary embodiment, the first differential output subcircuit 420 has a first transistor 421 gate connected to the drain of one of the input subcircuit transistors 411. The second output subcircuit transistor 422 gate is connected to the drain of the other input subcircuit transistor 412. In the exemplary embodiment, the first output is drawn from the first differential output subcircuit 420 transistor 421 source and transistor 422 source terminals. Furthermore, the second differential output subcircuit 430 is similarly connected, except the second differential output subcircuit 430 has a first transistor 431 gate connected to the drain of the input subcircuit transistor 411. The second output subcircuit transistor 432 gate is connected to the drain of the other input subcircuit transistor 412. In the exemplary embodiment, the second output (e.g., channel 2 430) is drawn from the second differential output transistor 431 source and transistor 432 source terminals.

In one exemplary embodiment, a first current sink device 441 is coupled to a device capable of storing energy, such as a first inductor 451 and/or a second inductor 452. In this exemplary embodiment the source of transistor 421 is coupled to inductor 451. In turn, inductor 451 is then coupled to the drain of current sink device 441. In this exemplary embodiment, the source of transistor 422 is coupled to inductor 452. Inductor 452 is then coupled to the drain of current sink device 441. In this exemplary embodiment, a second current sink device 442 is coupled to a device capable of storing energy, such as a third inductor 453 and a fourth inductor 454. In this exemplary embodiment, the source of transistor 431 is coupled to inductor 454. Inductor 454 is then coupled to the drain of current sink device 442. In this exemplary embodiment, the source of transistor 432 is coupled to inductor 453. In turn, inductor 453 is then coupled to the drain of current sink device 442. Each source of the current sink devices 453, 454 may be connected to ground.

The current sink devices may inject noise into the system. Devices capable of storing energy, such as inductors 451, 452, 453, and 454, may be configured to reduce the noise injected by the current sink devices. Since the signals appearing at the sources of transistors 421 and 422 are substantially 180 out of phase, a virtual short appears at the drain of current sink device 441. The virtual short thus reduces any noise generated by the current sink device 441. Similarly since the signals appearing at the sources of transistors 431 and 432 are substantially 180 out of phase, a virtual short appears at the drain of current sink device 442. The virtual short thus reduces any noise generated by the current sink device 442. Any suitable amount of inductance may be selected to reduce the noise injected by the current sink device. For instance, between 10 pH and 1 uH may be used as deemed by the circuit designer as appropriate for the frequency of application.

Vector Generator: In an exemplary embodiment, a vector generator converts an RF input signal into an output signal (sometimes referred to as an output vector) that is shifted in phase and/or amplitude to a desired level. This replaces the function of a typical phase shifter and adds the capability of amplitude control. In other words, a vector generator is a magnitude and phase control circuit. In the exemplary embodiment, the vector generator accomplishes this function by feeding the RF input signal into a quadrature network resulting in two output signals that differ in phase by about 90°. The two output signals are fed into parallel quadrant select circuits, and then through parallel variable gain amplifiers (VGAs). In an exemplary embodiment, the quadrant select circuits receive commands and may be configured to either pass the output signals with no additional relative phase shift between them or invert either or both of the output signals by an additional 180°. In this fashion, all four possible quadrants of the 360° continuum are available to both orthogonal signals. The resulting composite output signals from the current summer are modulated in at least one of amplitude and phase.

Figure 4:
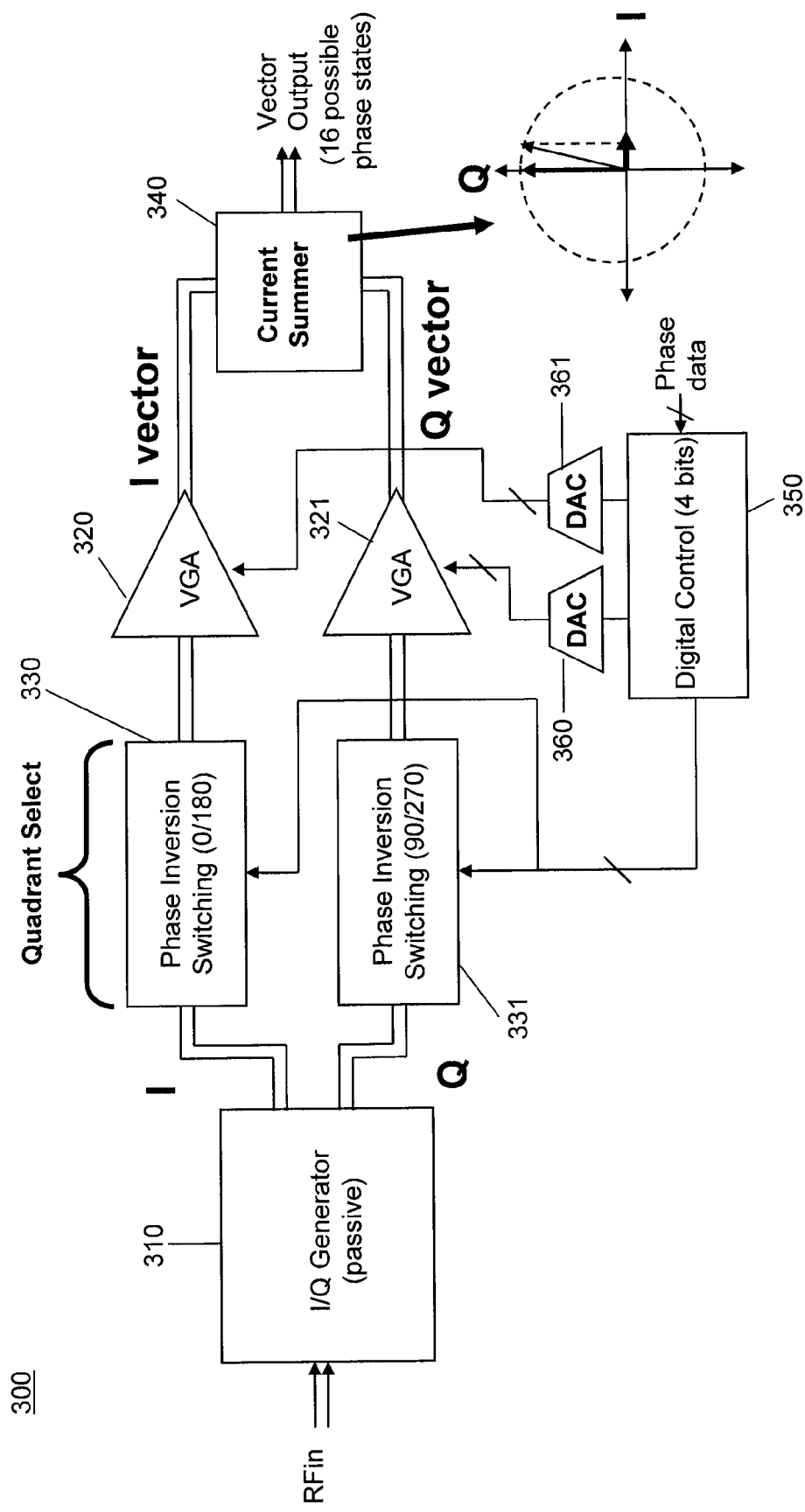
FIG. 4 illustrates an exemplary embodiment of an active vector generator.

In accordance with an exemplary embodiment and with reference to FIG. 4, a vector generator 300 comprises a passive I/Q generator 310, a first variable gain amplifier (VGA) 320 and a second VGA 321, a first quadrant select 330 and a second quadrant select 331 each configured for phase inversion switching, and a current summer 340. The first quadrant select 330 is in communication with I/Q generator 310 and first VGA 320. The second quadrant select 331 is in communication with I/Q generator 310 and second VGA 321. Furthermore, in an exemplary embodiment, vector generator 300 comprises a digital controller 350 that controls a first digital-to-analog converter (DAC) 360 and a second DAC 361. The first and second DACs 360, 361 control first and second VGAs 321, 320, respectively. Additionally, digital controller 350 controls first and second quadrant selects 330, 331.

In an exemplary embodiment, vector generator 300 controls the phase and amplitude of an RF signal by splitting the RF signal into two separate vectors, the in-phase (I) vector and the quadrature-phase (Q) vector. In one embodiment, the RF signal is communicated differentially. The differential RF signal communication may be throughout vector generator 300 or limited to various portions of vector generator 300. In another exemplary embodiment, the RF signal is communicated non-differentially. The I vector and Q vector are processed in parallel, each passing through the phase inverting switching performed by first and second quadrant selects 330, 331. The resultant outputs of the phase inverting switches comprise four possible signals: a non-inverted I, an inverted I, a non-inverted Q, and an inverted Q. In this manner, all four quadrants of a phasor diagram are available for further processing by VGAs 320, 321. In an exemplary embodiment, two of the four possible signals non-inverted I, inverted I, non-inverted Q, and inverted Q are processed respectively through VGA 320. In this exemplary embodiment, two of the four possible signals non-inverted I, inverted I, non-inverted Q, and inverted Q are processed through VGA 321. The two selected signals are combined in current summer 340 to form a composite RF signal. The current summer 340 outputs the composite RF signal with phase and amplitude adjustments. In an exemplary embodiment, the composite RF signal is in differential signal form. In another exemplary embodiment, the composite RF signal is in single-ended form.

In an exemplary embodiment, control for the quadrant shifting and VGA functions is provided by a pair of DACs. In an exemplary embodiment, reconfiguration of digital controller 350 allows the number of phase bits to be digitally controlled after vector generator 300 is fabricated if adequate DAC resolution and automatic gain control (AGC) dynamic range exists. In an exemplary embodiment with adequate DAC resolution and AGC dynamic range, any desired vector phase and amplitude can be produced with selectable fine quantization steps using digital control. In another exemplary embodiment, reconfiguration of DACs 360, 361 can be made after vector generator 300 is fabricated in order to facilitate adjustment of the vector amplitudes.

Time Delay: A variable time delay may be created by utilizing controlled impedance microstrip transmission line constructed using multiple layers of metal in standard integrated circuit fabrication. The top metal layer carries the signal, while the lower metal layers are used for ground reference. Several lower layers connected together through switching devices can be used so that the average height of the top metal layer above the ground can be adjusted. This time delay can be reconfigurable at any suitable time. This time delay may be created by any suitable device for creating a time delay and/or reconfigurable time delay.

Alternatively, in one embodiment, a time delay may be created by utilizing a stripline of any desired length. Varying the stripline length imparts a time delay of any suitable number of bits. Less time delay is utilized at higher frequencies. In one exemplary embodiment, the amplitudes of each path can be weighted so that the sum of all parallel paths forms a desired response. For example, in one exemplary embodiment, two parallel paths may be configured with a time delay difference of T/2 and with VGAs set to the same amplitude. In this exemplary embodiment, the response would have a deep null at the frequency equal to 1/T because the voltage in the two parallel paths would be equal with 180 degree phase difference. The depth of the null may be adjusted by changing the VGAs so that the two paths had different amplitudes. The effect is similar to that of digital finite impulse response filters.

Variable Gain Amplifier: In accordance with an exemplary embodiment, a variable gain amplifier (VGA) comprises an electronic amplifier that varies its gain depending on a control voltage. In one exemplary embodiment, the VGA varies the voltage gain in an RF path. In one exemplary embodiment, the VGA is digitally controlled. In one exemplary embodiment, the VGA may vary the voltage gain in an RF path to a pre-selected level. This level may be adjusted at any suitable time to any desirable level. This VGA may be created by any suitable electronic amplifier device that varies its gain depending on a control voltage. In one exemplary embodiment, the VGA may be a vector generator as described above.

Active Preselector Amplifier: In accordance with an exemplary embodiment, an active preselector amplifier comprises active components manufactured on silicon germanium (SiGe) in a monolithic solution. Other materials may be used, such as GaAs, silicon, or other suitable materials now known or hereinafter devised. A monolithic SiGe embodiment using active components results in certain advantages over the prior art passive amplifier technology. The active preselector amplifier may have a lower cost of the system and/or materials of the system. The preselector amplifier may comprise a smaller physical size of the system than the prior art passive preselector amplifier. Another advantage over the prior art may include configurable operating bandwidths. For example, in an exemplary embodiment, an active preselector amplifier may be configured to operate over an approximate 18 GHz bandwidth between frequencies of about 6 GHz and about 24 GHz.

Additionally, RF signals may undergo a neutral or slight positive power gain when being communicated through the preselector amplifier, rather than power losses that occur in the passive prior art systems. For instance, in an exemplary embodiment, the active splitters and active combiners are not a power sink. Likewise, the active filter may provide a power gain rather than a power loss over a prior art passive filter. Also, in an exemplary embodiment, the preselector amplifier system is not band limited.

Figure 5A:
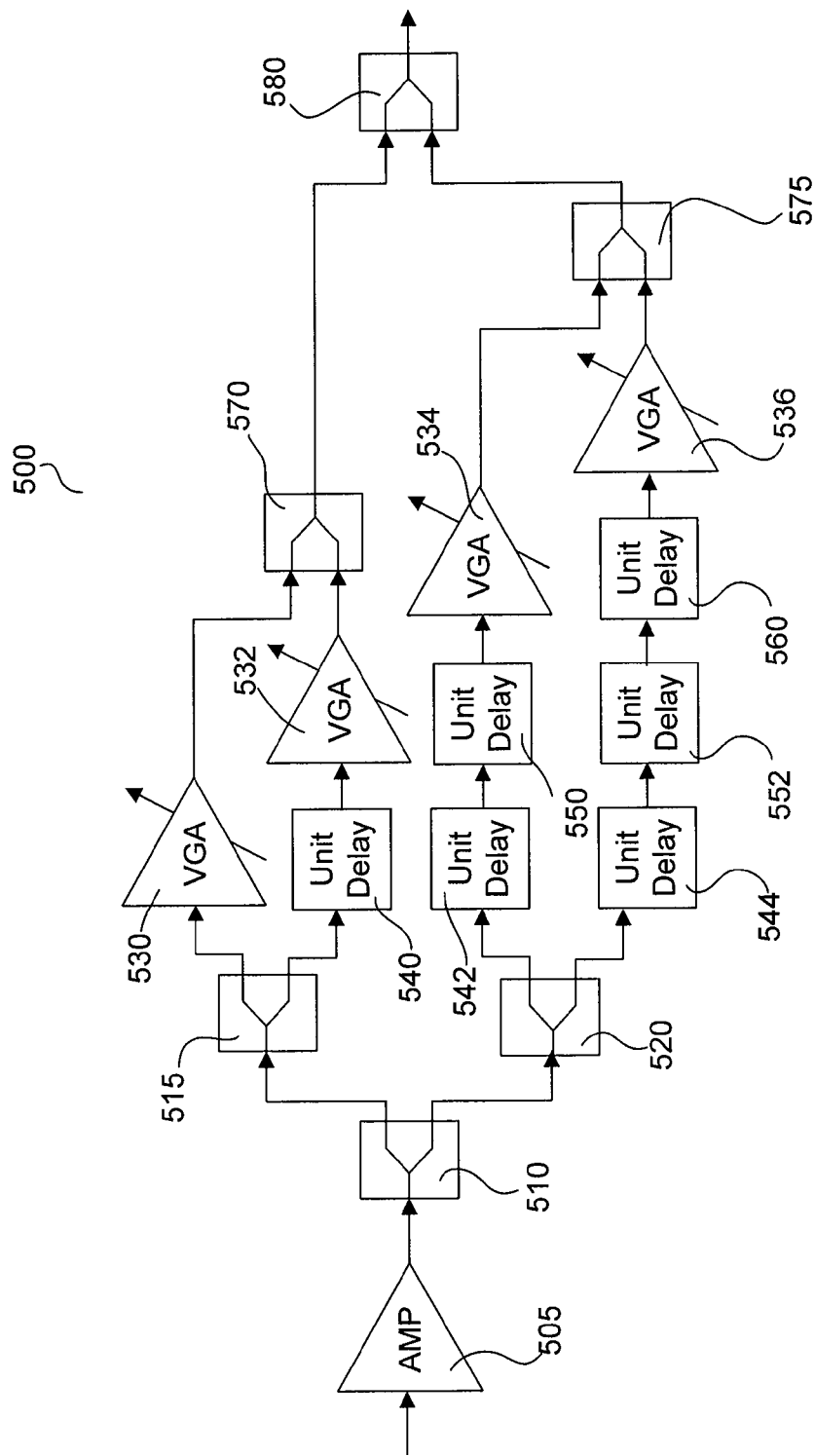
FIGS. 5A and 5B illustrate exemplary embodiments of a preselector amplifier system.

In accordance with an exemplary embodiment and with reference to FIG. 5A, an active preselector amplifier 500 comprises active splitters (e.g. 510, 515, 520), active combiners (e.g. 570, 575, 580), variable gain amplifiers (VGA) (e.g. 530, 532, 534, 536), unit delays (e.g. 540, 542, 544, 550, 552, 560) and an amplifier (e.g. 505). The exemplary embodiment of FIG. 5A may be referred to as a symmetric split, symmetric combine, independent delay, even number of paths (i.e. 4 paths) embodiment. In accordance with an exemplary embodiment and with further reference to FIG. 5A, a first amplifier 505 may be coupled to first active splitter 510.

The first active splitter 510 may be coupled to a second active splitter 515, and a third active splitter 520. The output of the second active splitter 515 may be coupled to variable gain amplifier 530 and unit delay 540. The output of VGA 530 may be coupled to active combiner 570. The output of unit delay 540 may be coupled to VGA 532. The output of VGA 532 may be coupled to active combiner 570.

The output of the third active splitter 520 may be coupled to unit delay 542 and unit delay 544. In turn, unit delay 542 may be coupled to unit delay 550. Unit delay 550 may be coupled to VGA 534. The output of VGA 534 may be coupled to active combiner 575. The output of unit delay 544 may be coupled to unit delay 552. The output of unit delay 552 may be coupled to unit delay 560. The output of unit delay 560 may be coupled to VGA 536. The output of VGA 536 may be coupled to active combiner 575.

The output of active combiner 570 may be coupled to active combiner 580. The output of active combiner 575 may be coupled to 580. The output of active combiner 580 may used by the communication system. System 500 may be expanded as many times as desired as multiple parallel paths are implemented.

As used herein, coupling an output to a second component may, where appropriate, denote connecting (directly or indirectly) the output to one of the inputs of the second component.

Figure 5B:
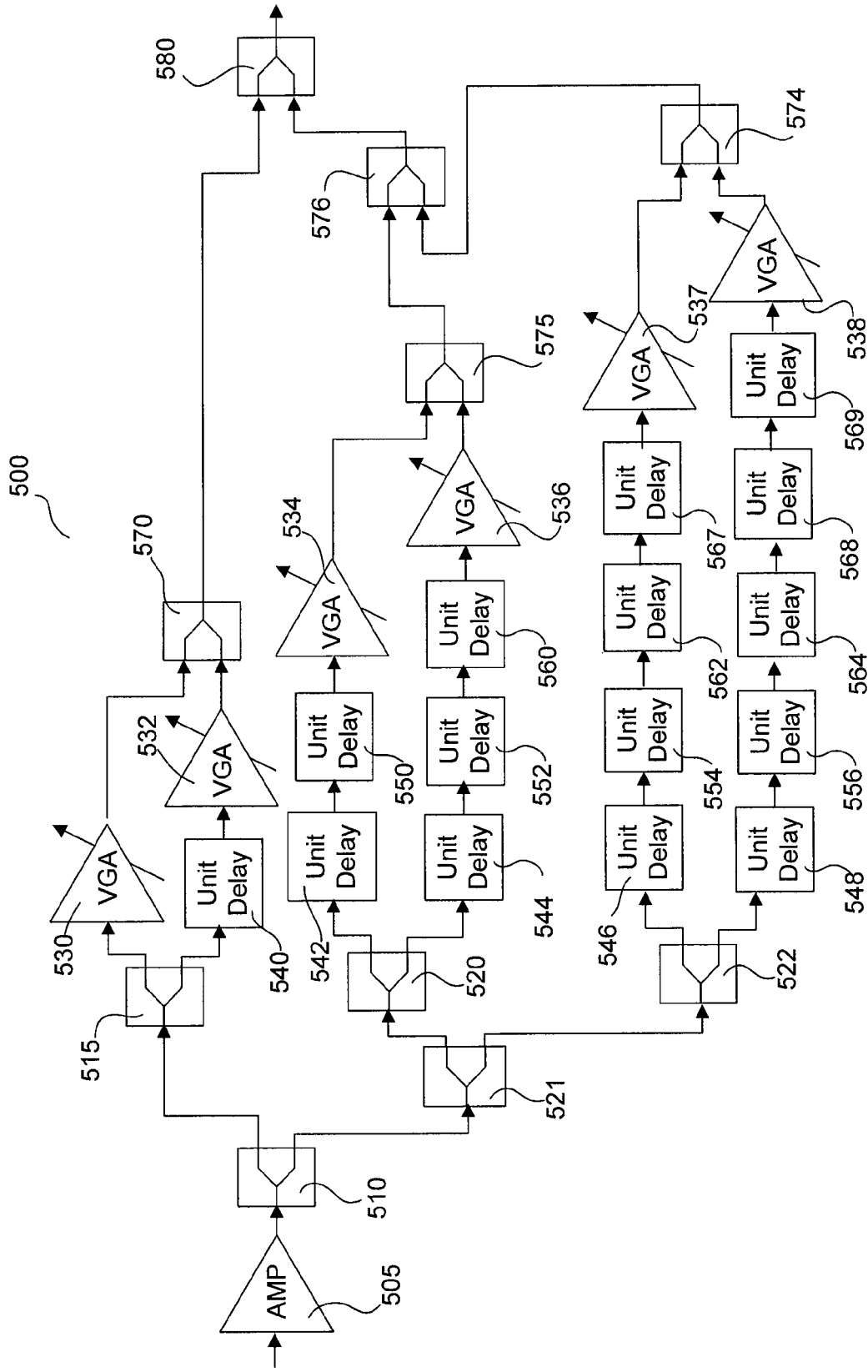

The exemplary embodiment of FIG. 5B may be referred to as a symmetric split, symmetric combine, independent delay, odd number of paths (i.e. 5 paths) embodiment. For example, in one embodiment, expanded system 500 may include coupling the output of active splitter 521 to active power splitter 520 and active power splitter 522. The output of active splitter 520 may be coupled to unit delay 542 and unit delay 544. The output of active splitter 522 may be coupled to a first path comprising a plurality of unit delays and VGA 537 coupled in series and a second path comprising a plurality of unit delays and VGA 538 coupled in series. The outputs of VGA 537 and VGA 538 may be coupled to active combiner 574. The output of active combiner 574 and active combiner 575 may be coupled to active combiner 576. Active combiner 576 may be coupled to active combiner 580. All other elements of FIG. 5B are connected as previously described.

Figure 6A:
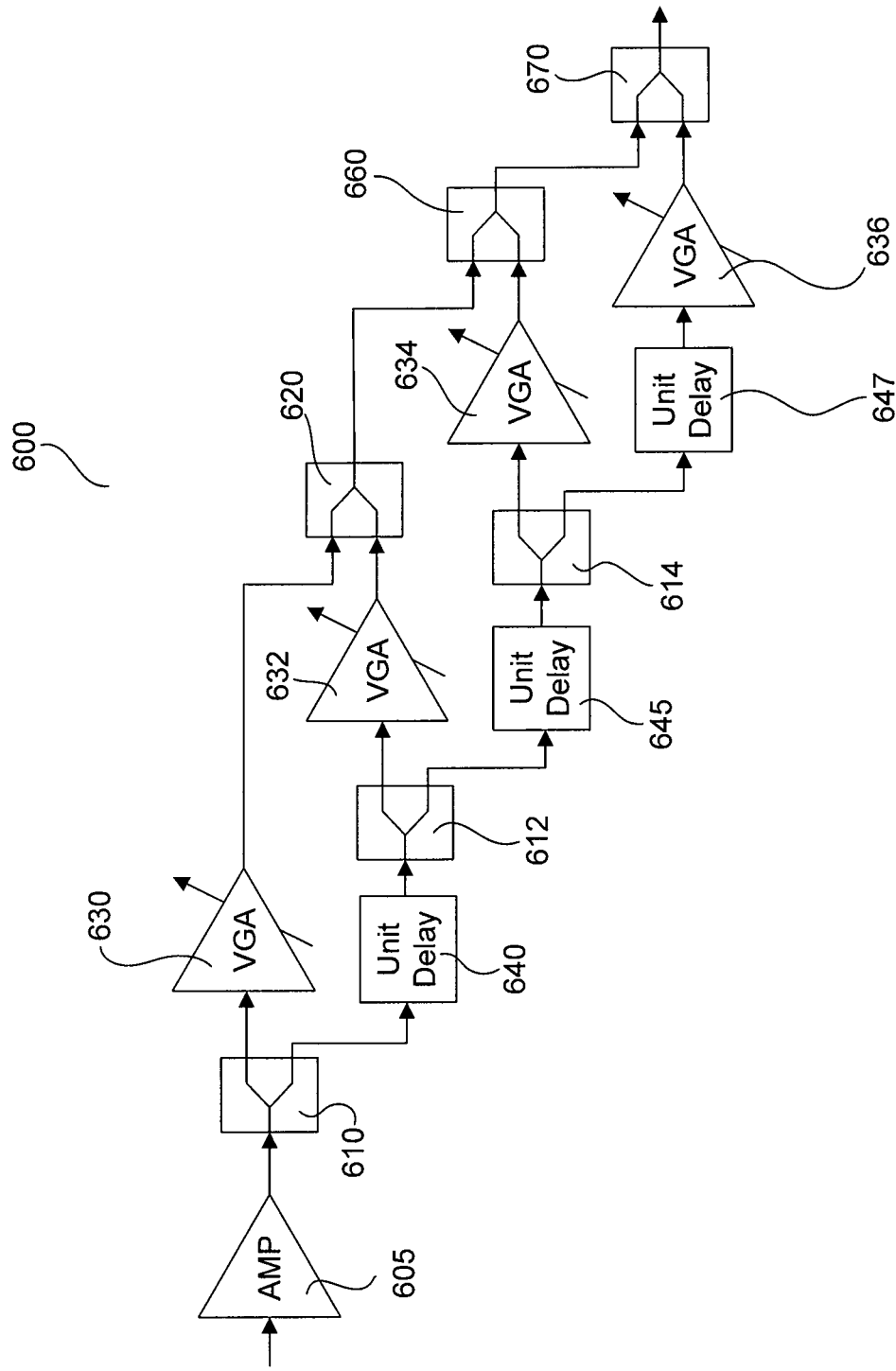
FIGS. 6A and 6B illustrate additional exemplary embodiments of a preselector amplifier system.

In an exemplary embodiment with reference to FIG. 6A, an active preselector amplifier may be referred to as a cascaded split, cascaded combine, shared delay, even number of paths (i.e. 4 paths) embodiment. In accordance with an exemplary embodiment and with reference to FIG. 6A, another active preselector amplifier 600 comprises active splitters (e.g. 610, 612, 614), active combiners (e.g. 620, 660, 670), variable gain amplifiers (e.g. 630, 632, 634, 636), unit delays (e.g. 640, 645, 647) and an amplifier (e.g. 605). In accordance with an exemplary embodiment and with further reference to FIG. 6A, amplifier 605 is coupled to active splitter 610.

The output of active splitter 610 may be coupled to VGA 630 and unit delay 640.

The output of VGA 630 may be coupled to active combiner 620. The output of unit delay 640 may be coupled to active splitter 612. The output of active splitter 612 may be coupled to VGA 632 and unit delay 645. The output of VGA 632 may be coupled to active combiner 620. The output of active combiner 620 may be coupled to active combiner 660. The output of unit delay 645 may be coupled to active splitter 614. The output of active splitter 614 may be coupled to VGA 634. The output of VGA 634 may be coupled to active combiner 660. The output of active combiner 660 may be coupled to active combiner 670. The output of active combiner 614 may be coupled to unit delay 647. The output of unit delay 647 may be coupled to VGA 636. The output of VGA 636 may be coupled to active combiner 670. The output of active combiner 670 may used by the communication system. For instance, the output of active combiner 670 may be provided to a down converter and tuner.

Figure 6B:
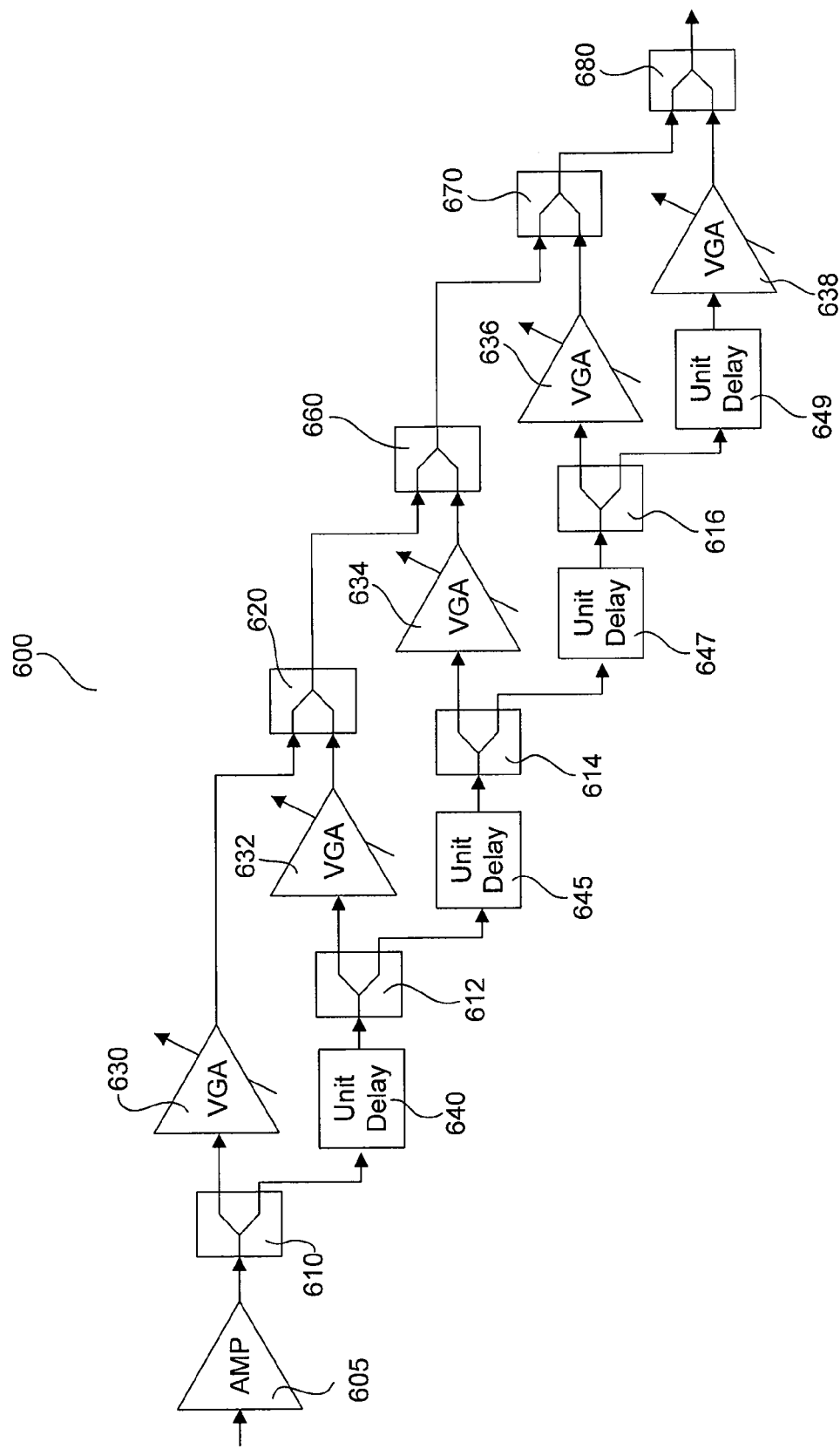

System 600 may be expanded as multiple parallel paths are implemented as desired. In an exemplary embodiment with reference to FIG. 6B, an active preselector may be referred to as a cascaded split, cascaded combine, shared delay, odd number of paths (i.e. 5 paths) embodiment. For instance, as depicted in FIG. 6B, active power splitter 616 may receive the output of unit delay 647. The output of active power splitter 616 may be fed to VGA 636 and unit delay 649. The output of unit delay 649 may be fed to VGA 638. The output of VGA 638 may be fed to active combiner 680. The output of active combiner 670 may be fed to active combiner 680. The output of active combiners 680 may be may used by the communication system. All other elements of FIG. 6B are connected as previously described. This expansion may be replicated in a similar fashion as many times as desired.

Figure 7:
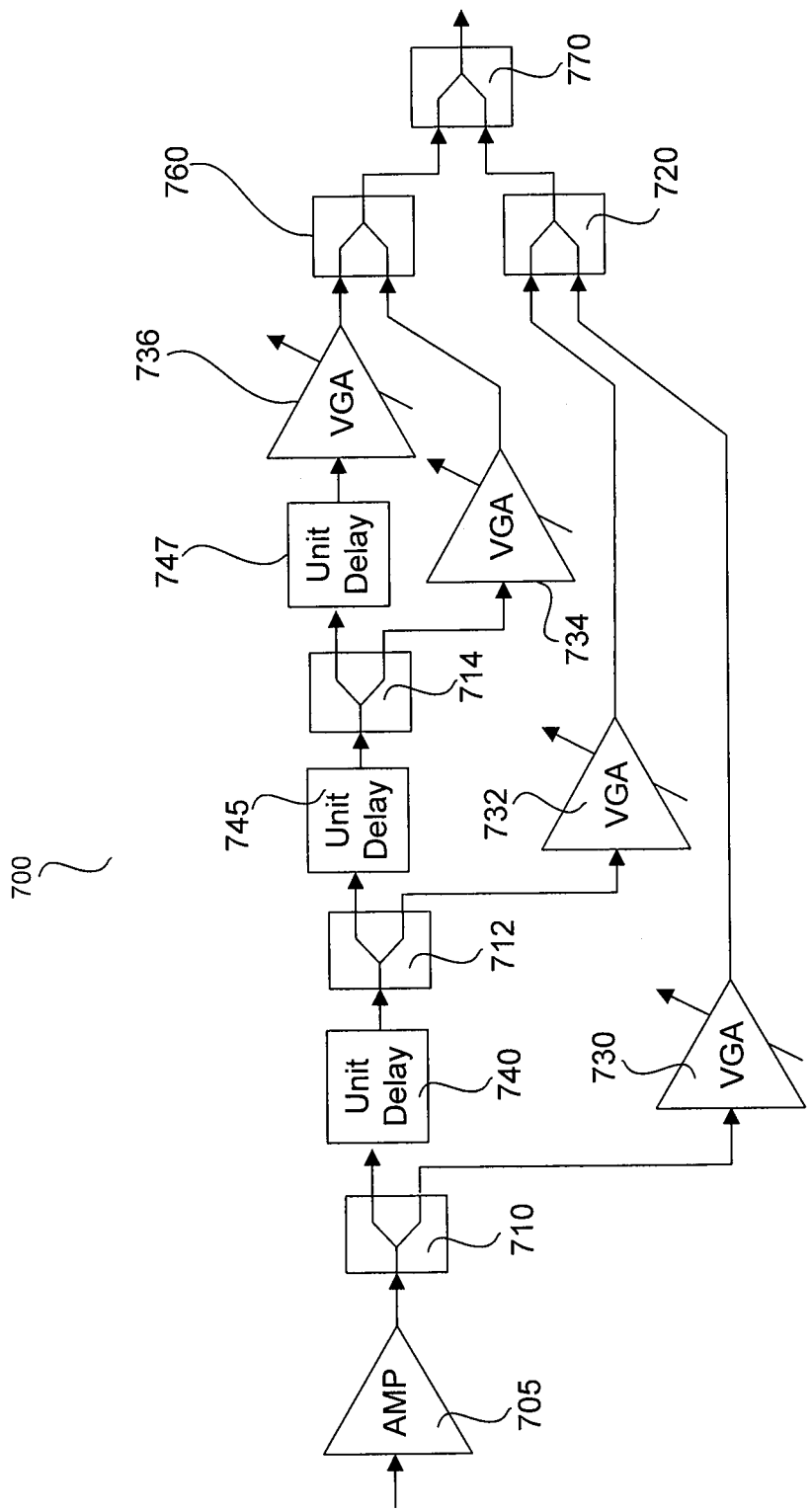
FIG. 7 illustrates yet another exemplary embodiment of a preselector amplifier system.

The exemplary embodiment of FIG. 7 may be referred to as a cascaded split, symmetric combine, shared delay, even number of paths (i.e. 4 paths) embodiment. In accordance with an exemplary embodiment, an active preselector amplifier 700 comprises active splitters (e.g. 710, 712, 714), active combiners (e.g. 720, 760, 770), variable gain amplifiers (e.g. 730, 732, 734, 736), unit delays (e.g. 740, 745, 747) and an amplifier (e.g. 705). In accordance with an exemplary embodiment and with further reference to FIG. 7, amplifier 705 is coupled to active splitter 710.

The output of active splitter 710 may be coupled to VGA 730 and unit delay 740. The output of VGA 730 may be coupled to active combiner 720. The output of unit delay 740 may be coupled to active splitter 712. The output of active splitter 712 may be coupled to VGA 732 and unit delay 745. The output of unit delay 745 may be coupled to active splitter 714. The output of active splitter 714 may be coupled to VGA 734 and unit delay 747. The output of VGA 734 may be coupled to active combiner 760. The output of unit delay 747 may be coupled to VGA 736. The output of VGA 736 may be coupled to active combiner 760. The output of active combiner 760 and active combiner 720 may be coupled to active combiner 770. The output of active combiner 770 may used by the communication system.

Any of the aforementioned active combiners (including those of FIGS. 5-7) could be replaced by passive combiners. Any of the aforementioned active splitters (including those of FIGS. 5-7) could be replaced by passive splitters. Amplifier 505, 605, and 705, with renewed reference to FIGS. 5-7, could be replaced by a low noise amplifier or other suitable amplifier.

In accordance with an exemplary embodiment, preselector amplifier (e.g. preselector amplifiers 500, 600, and 700) may comprise active components manufactured on silicon germanium (SiGe) in a monolithic solution. Other materials may be used, such as GaAs, silicon, or other suitable materials now known or hereinafter devised. However, (as mentioned previously) a monolithic SiGe embodiment using active components results in certain advantages over the prior art, including lower cost, smaller physical size, adjustable bandwidth, and the ability to provide power gain rather than a power loss.

Figure 8:
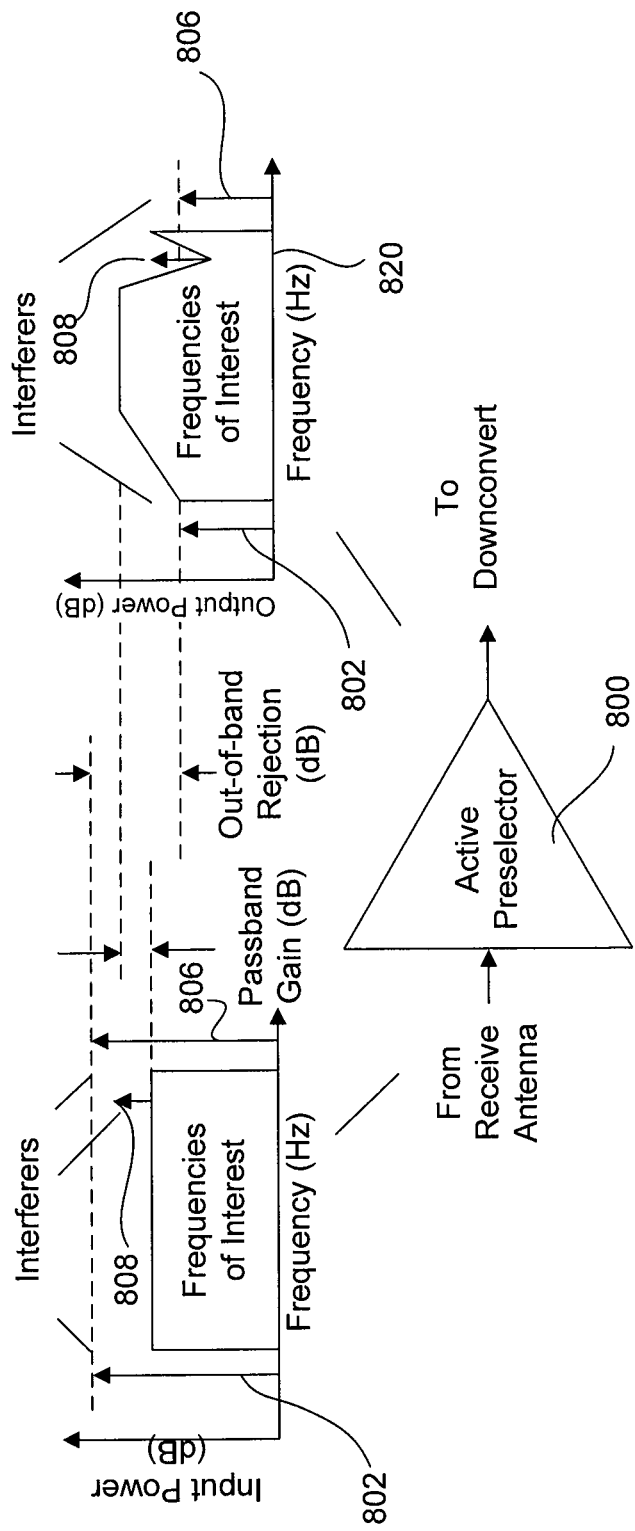
FIG. 8 illustrates an exemplary embodiment of a preselector amplifier frequency plan.

With reference to FIG. 8, the operation of a preselector amplifier 800 according to one exemplary embodiment is depicted. In one exemplary embodiment, an active preselector amplifier 800 comprises an active amplifier such as, for example preselector amplifier 500, 600, or 700. In one exemplary embodiment, active preselector amplifier 800 is configured to perform the functions of both the prior art passive filter and low noise amplifier. In one exemplary embodiment, active preselector 800 attenuation characteristics may be configured during operation. In one exemplary embodiment attenuation characteristics include band pass behavior. In one exemplary embodiment attenuation characteristics include band reject filtering to attenuate in-band interferers (for example, as seen in FIG. 8).

With renewed reference to FIG. 8, in-band interferers, such as interferer 808, are attenuated. Likewise, interferers 802 and 806 are attenuated. The choppy resultant frequency of interest 820 may be smoothed as a function of adding additional parallel paths. The frequencies of interest may be any frequency, frequencies and/or frequency range or ranges or frequencies. In one embodiment the frequencies may be frequencies within the C band, H band, X band, Ku band, K band, Ka band, Q band, U band, V band or a combination thereof Additionally, as parallel paths are added, targeting of the in-band interferers may be honed. For instance, the bands of the frequencies increasingly narrow to approach individual frequencies as additional parallel paths are added. In one exemplary embodiment the system tuning is a function of selecting appropriate gains through the VGAs.

Figure 9:
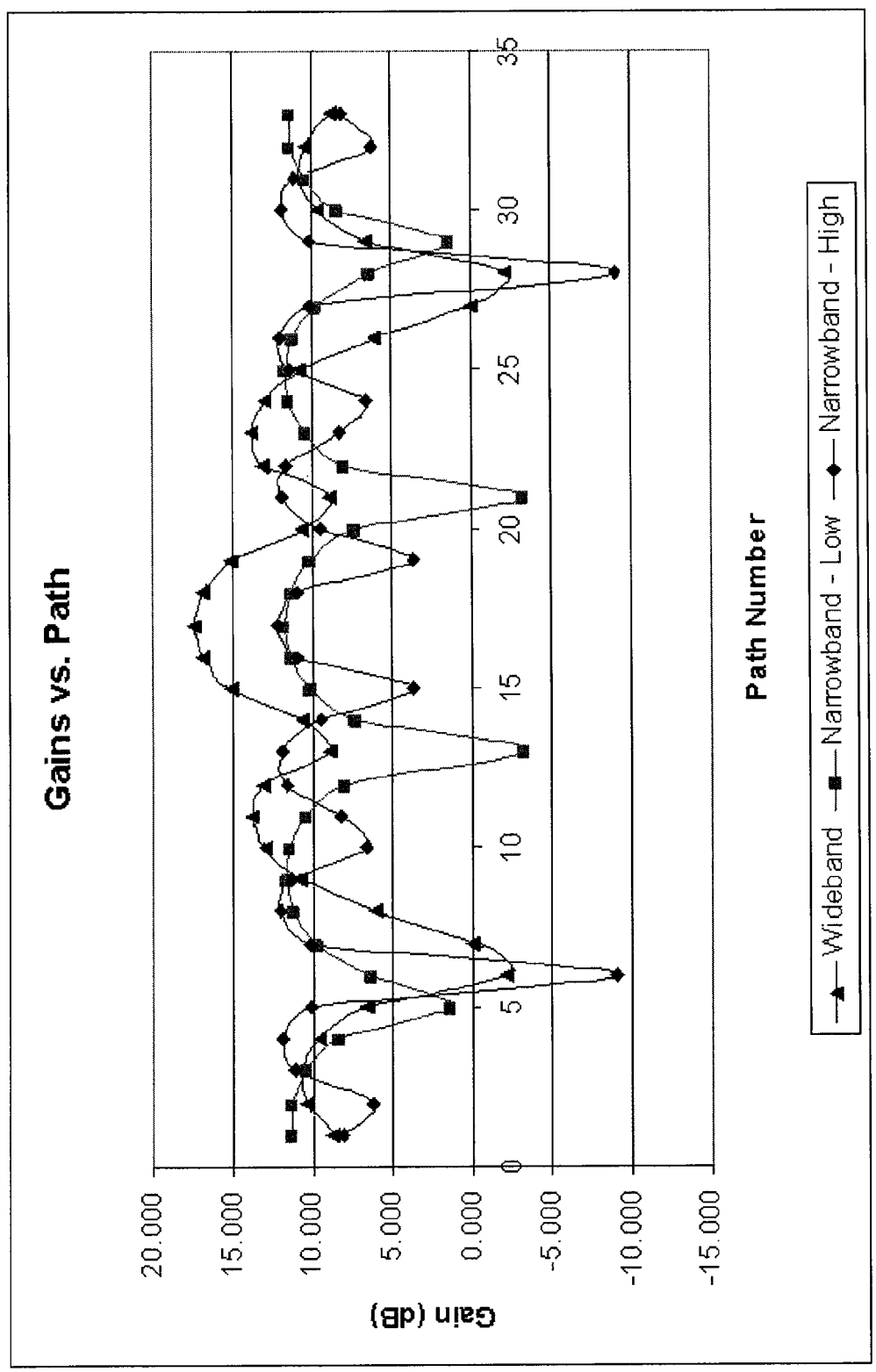
FIG. 9 illustrates gains selected for a 33 path embodiment of the system depicted in FIG. 5A.
Figure 10:
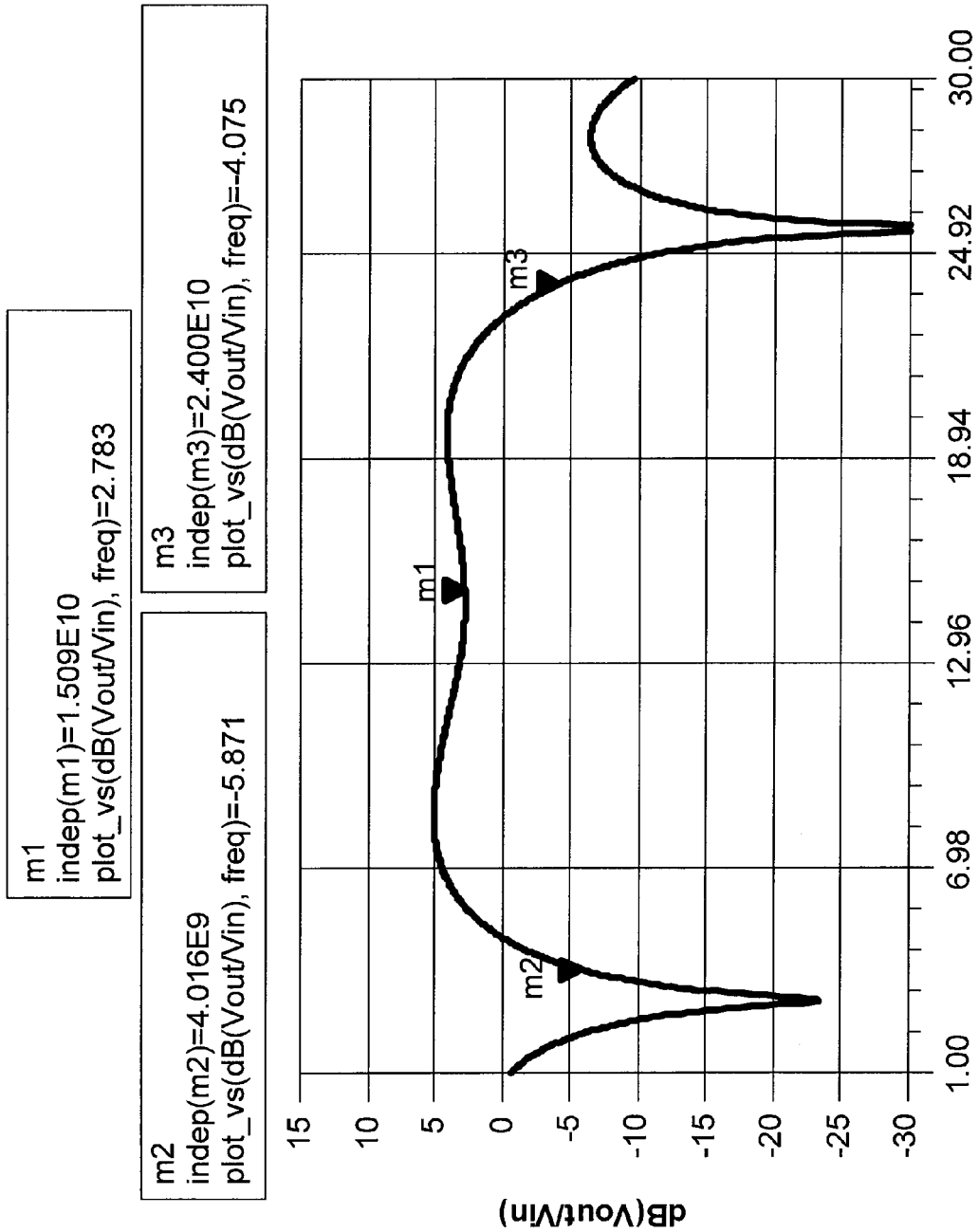
FIG. 10 illustrates an exemplary plot of system gain versus frequency with a wide passband and out-of-band rejection at 2 GHz and 25 GHz.
Figure 11:
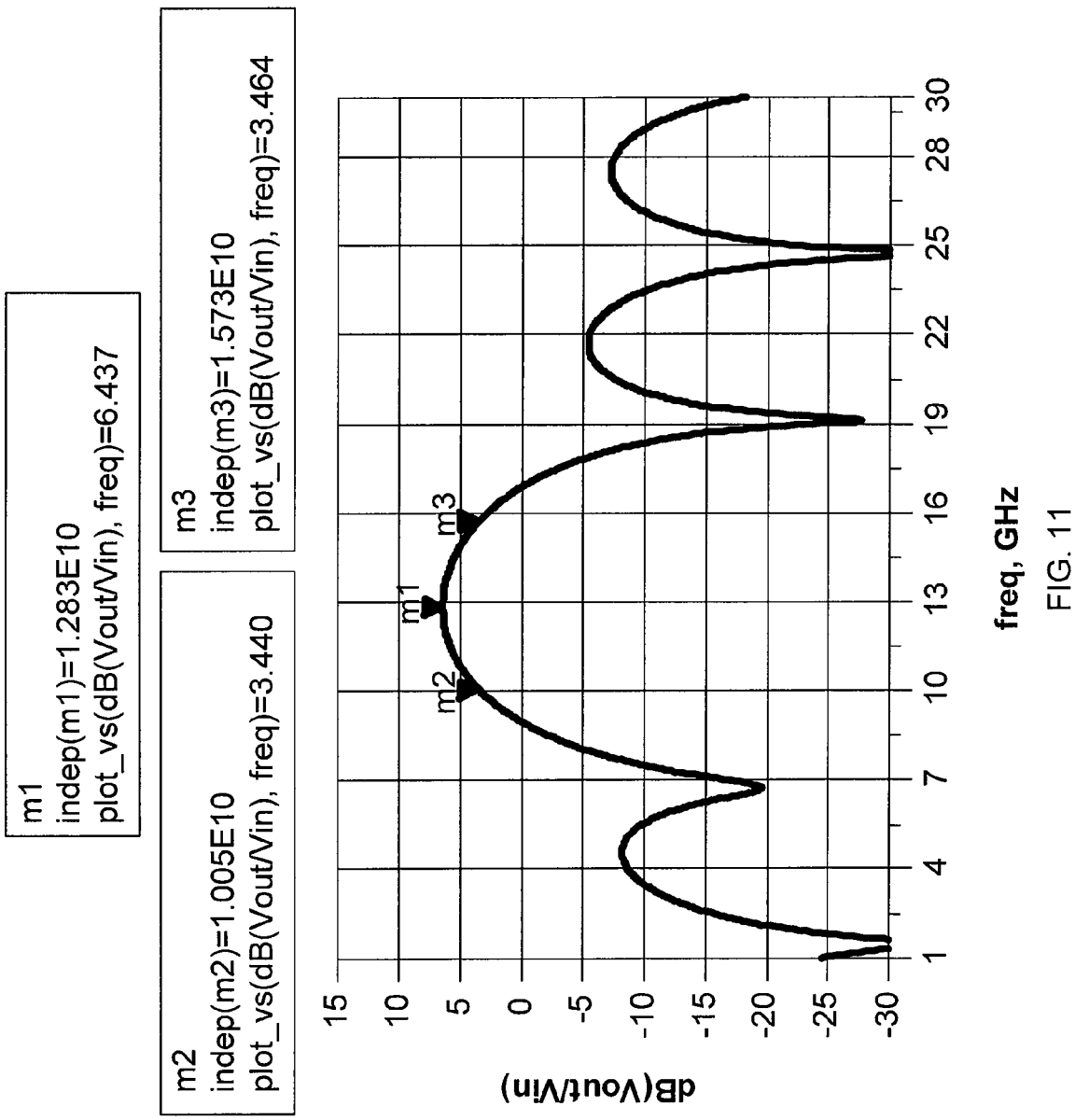
FIG. 11 illustrates an exemplary plot of system gain versus frequency with a narrowed passband.
Figure 12:
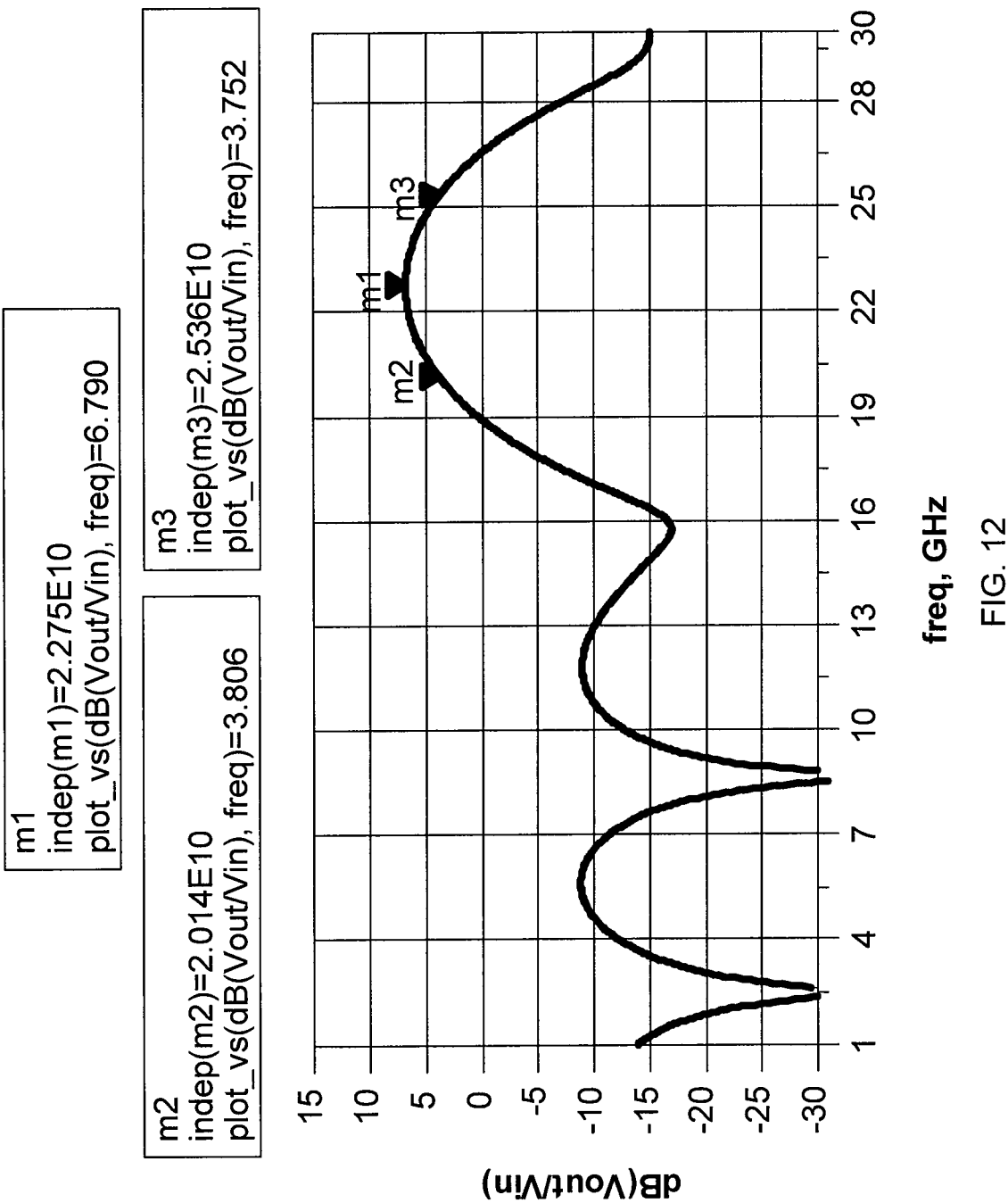
FIG. 12 illustrates an exemplary plot of system gain versus frequency with a shifted passband.

In an exemplary embodiment and with reference with to FIG. 9, the gains of a 33 path embodiment of the system 500 (with renewed reference to FIG. 5A) are depicted. In this embodiment VGA gains in VGA 1 through 33 are depicted. For example, and with reference to FIGS. 10-12, three exemplary frequency responses are displayed generated using a 33 path embodiment of system 500 of FIG. 5A and VGA gains as depicted in FIG. 9. In an exemplary embodiment out-of-band rejection as related to input power is shown on FIG. 8. In one exemplary embodiment, the out-of-band rejection may be described as a plot of system gain versus frequency. FIG. 10 illustrates an exemplary plot of system gain versus frequency with a wide passband and out-of-band rejection at 2 GHz and 25 GHz. FIG. 11 illustrates an exemplary plot of system gain versus frequency with a narrowed passband. FIG. 12 illustrates an exemplary plot of system gain versus frequency with a shifted passband. There is no limit to the number of parallel paths that may be added to the preselector amplifier system. However, additional paths will increase, cost, power consumption, size and potential for faulty equipment. In one exemplary embodiment greater than 32 parallel paths may facilitate sharp response.

In one exemplary embodiment the preselector amplifier does not include a low noise amplifier. In one exemplary embodiment the preselector amplifier does not include a passive filter.

The active preselector amplifier is configured to operate as an integrated combination of a wide-band distributed amplifier and a parallel plurality of variable gain amplifiers with incremental increases in unit delay in each parallel path. The parallel paths may resemble a digital finite impulse response filter. For instance, in a digital finite impulse response filter, the filter's response to a Kronecker delta input is finite because it settles to zero in a finite number of sample intervals.

The various unit delays discussed with reference to FIGS. 5, 6 and 7 may be a time delay and/or phase shift. In one exemplary embodiment, a phase shift may be provided by a vector generator. For example, each unit delay may comprise an active vector generator (e.g. element 300 in FIG. 4). This phase shift can be reconfigurable at any suitable time. Thus, any phase shift desired may be achieved. Alternatively, a phase shift may be provided by utilizing a phase shifter and/or the like. In one exemplary embodiment, a time delay may be provided by a fixed or variable delay microstrip line. For example, each unit delay may comprise a 30 micrometer long microstrip. Furthermore, these unit delays may comprise any device suitable for creating a time delay and/or phase shift such as those described herein.

With renewed reference to FIGS. 5A and 5B, the VGAs in the parallel paths may operate at the same signal levels by using unequal power splitters to overcome the signal attenuation in the unit delays. The loss through the power splitter and unit delays may degrade noise figure. To overcome degradations in the noise figure, active splitter techniques may be used as described in FIG. 2. With renewed reference to FIGS. 5A, 5B, 6A, 6B and 7, in systems 500, 600 and 700 a delay line is created with taps fed to variable gain amplifiers. The signal levels may vary at each path. In one exemplary embodiment, the noise figure of system 600 and 700 may degrade. Implementing amplification (such as 3 dB amplification) at the unit delays resolves the noise figure degradation.

In one exemplary embodiment the preselector amplifier may receive a frequency band of interest. The frequency band of interest may be any suitable frequency band. In one exemplary embodiment, the frequency band of interest includes a frequencies range(s) between 6 GHz and 24 GHz. The frequency band of interest may be configurable at any suitable time. Interferers may be identified in subsequent signal processing. In one exemplary embodiment, the preselector amplifier is configured to attenuate in-band interferers. In one exemplary embodiment, the active filter is configured to perform the filtering that causes this attenuation. The filtering may be configurable at any suitable time. For instance, this configurability may be provided via digital control changes to a unit delay and/or gain changes provided to a VGA. In one exemplary embodiment, the preselector amplifier may attenuate out-of-band interferers. Out-of-band interferers may be those interferers outside the frequencies of interest. The attenuating may occur in response to filtering performed by the active filter. The filtering may be configurable at any suitable time.

Additionally, other advantages over the prior art embodiments are possible. Some of the advantages include being configured for broadband enabled operation over multiple frequency bands and very compact amplifiers because no distributed structures are required. In an exemplary embodiment, another advantage is the preselector amplifier being software reconfigurable for optimum cancellation of undesired signals. Furthermore, some embodiments employ differential signaling to confine electromagnetic fields, improve signal isolation and noise immunity when the RF signal is in analog form.

The following applications are related to this subject matter: U.S. application Ser. No. 12/759,123, entitled "ACTIVE BUTLER AND BLASS MATRICES," which is being filed contemporaneously herewith; U.S. application Ser. No. 12/759,043, entitled "ACTIVE HYBRIDS FOR ANTENNA SYSTEMS," which is being filed contemporaneously herewith; U.S. application Ser. No. 12/759,064, entitled "ACTIVE FEED FORWARD AMPLIFIER," which is being filed contemporaneously herewith U.S. application Ser. No. 12/759,130, entitled "ACTIVE PHASED ARRAY ARCHITECTURE," which is being filed contemporaneously herewith; U.S. application Ser. No. 12/759,059, entitled "MULTI-BEAM ACTIVE PHASED ARRAY ARCHITECTURE," which is being filed contemporaneously herewith; U.S. Application Ser. No. 12/759,148, entitled "ACTIVE POWER SPLITTER," which is being filed contemporaneously Herewith; U.S. application Ser. No. 12/759,112, entitled, "HALF-DUPLEX PHASED ARRAY ANTENNA SYSTEM," which is being filed contemporaneously herewith; U.S. application Ser. No. 12/759,113, entitled "DIGITAL AMPLITUDE CONTROL OF ACTIVE VECTOR GENERATOR," which is being filed contemporaneously herewith; the contents of which are hereby incorporated by reference for any purpose in their entirety.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

What is claimed is:

1. A communications system, comprising:
a filter, wherein the filter is configured to receive a frequency band of interest;
and wherein the filter is configured to attenuate in-band interferers and attenuate out-of-band interferers;
wherein the filter is reconfigurable during operation by digital or analog controls without changes in cavity shape, circuit capacitance, or circuit inductance.

2. The system of claim 1, wherein the filter comprises an active preselector.

3. The system of claim 2, wherein the active preselector amplifies signals.

4. The system of claim 2, wherein the active preselector losses are less than 3 dB.

5. The system of claim 2, wherein the active preselector comprises an active vector generator.

6. The system of claim 5, wherein the active vector generator comprises a first quadrant select in parallel with a second quadrant select and a first variable gain amplifier in parallel with a second variable gain amplifier.

7. The system of claim 5, wherein a DAC is coupled to and controls the active vector generator.

8. The system of claim 2, wherein the active preselector comprises an active power splitter.

9. The system of claim 2, wherein the active preselector comprises an active power combiner.

10. The system of claim 2, wherein the active preselector comprises a unit delay module.

11. The system of claim 10, wherein the unit affected by the unit delay module is one of phase, time, or a combination thereof.

12. The system of claim 10, wherein the unit delay module comprises a vector generator.

13. is The system of claim 12, wherein the vector generator comprises a first quadrant select in parallel with a second quadrant select and a first variable gain amplifier in parallel with a second variable gain amplifier.

14. The system of claim 1, wherein the system does not comprise a low noise amplifier.

15. The system of claim 1, wherein the system does not comprise a passive filter.

16. The system of claim 1, wherein the filter is implemented in a monolithic microwave integrated circuit.

17. The system of claim 1, wherein the filter is an active filter.

18. The system of claim 1, wherein the frequency band of interest is a range of frequencies within one of the C band, H band, X band, Ku band, K band, Ka band, Q band, U band V band or a combination thereof.

19. The system of claim 1, wherein the communications system is at least one of a transceiver, receiver or transmitter.

20. The system of claim 17, wherein the active filter is configured to be modified to attenuate in-band interferers in response to identification of the in-band interferers.

21. A method, comprising:
   receiving a frequency band of interest; wherein the frequency band of interest is configurable during operation;
   attenuating in-band interferers, wherein the attenuating occurs in response to filtering performed by an active filter; wherein the filtering is configurable during operation; and
   attenuating out-of-band interferers, wherein the attenuating occurs in response to filtering performed by the active filter; wherein the filtering is configurable during operation.

22. The method of claim 21, wherein the method does not comprise use of a low noise amplifier.

23. The method of claim 21, wherein the method does not comprise use of a passive filter.

24. The method of claim 21, further comprising:
   amplifying received signals;
   identifying in-band interferers; and
   automatically modifying the active filter to attenuate identified interferers in response to the identification.

25. The method of claim 24, wherein the identified interferers are one of in-band interferers, out-of-band interferers or a combination thereof.

26. An active preselector amplifier having an input and an output comprising:
   at least one splitter, combiner, and delay unit configured to form a plurality of signal paths between the active preselector amplifier input and the active preselector amplifier output,
   wherein at least one of the splitter, combiner, and delay unit comprise an active splitter, active combiner, and vector generator respectively,
   wherein the active preselector amplifier is configured to attenuate in-band and out-of-band interferers.

27. The active preselector amplifier of claim 26, wherein the vector generator comprises a first quadrant select in parallel with a second quadrant select and a first variable gain amplifier in parallel with a second variable gain amplifier.

* * * * *

UNITED STATES PATENT AND TRADEMARK OFFICE
CERTIFICATE OF CORRECTION

| | | |
|---|---|---|
| PATENT NO. | : 8,452,251 B2 | Page 1 of 1 |
| APPLICATION NO. | : 12/758996 | |
| DATED | : May 28, 2013 | |
| INVENTOR(S) | : David R. Saunders | |

It is certified that error appears in the above-identified patent and that said Letters Patent is hereby corrected as shown below:

In the Claims:

Column 13, Line 3, Claim 18 should read:

18. The system of claim 1, wherein the frequency band of interest is a range of frequencies within one of the C band, H band, X band, Ku band, K band, Ka band, Q band, U band, V band or a combination thereof.

Signed and Sealed this
Ninth Day of July, 2013

Teresa Stanek Rea
*Acting Director of the United States Patent and Trademark Office*